(12) United States Patent
Roper et al.

(10) Patent No.: US 10,974,959 B1
(45) Date of Patent: Apr. 13, 2021

(54) METHODS FOR CHARGE-TITRATING ASSEMBLY OF PARTIALLY METALLIZED NANOPARTICLES, AND METAMATERIALS PRODUCED THEREFROM

(71) Applicant: HRL Laboratories, LLC, Malibu, CA (US)

(72) Inventors: Christopher S. Roper, Santa Monica, CA (US); Adam F. Gross, Santa Monica, CA (US); Shanying Cui, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 410 days.

(21) Appl. No.: 16/011,834

(22) Filed: Jun. 19, 2018

Related U.S. Application Data

(63) Continuation-in-part of application No. 15/241,536, filed on Aug. 19, 2016, now Pat. No. 10,189,718.
(Continued)

(51) Int. Cl.
*B82B 3/00* (2006.01)
*G02B 6/293* (2006.01)
(Continued)

(52) U.S. Cl.
CPC .......... *B82B 3/0052* (2013.01); *B82B 3/0014* (2013.01); *G02B 1/002* (2013.01);
(Continued)

(58) Field of Classification Search
CPC ..... B82B 3/0052; B82B 3/0014; G02F 1/065; G02F 2202/30; G02B 1/002; G02B 6/29338; B82Y 30/00; B82Y 40/00
See application file for complete search history.

(56) References Cited

U.S. PATENT DOCUMENTS 5,534,461 A 7/1996 Kuwajima
5,591,535 A 1/1997 Hisano et al.
(Continued)

FOREIGN PATENT DOCUMENTS

WO WO2008048293 * 4/2008

OTHER PUBLICATIONS

Wang et al. ("Patterning the Surface of Colloidal Microspheres and Fabrication of Nonspherical Particles," Angew. Chem. Int. Ed., 47, 4725-4728, 2008) (Year: 2008).*
(Continued)

*Primary Examiner* — Yasser A Abdelaziez
(74) *Attorney, Agent, or Firm* — O'Connor & Company

(57) ABSTRACT

Variations provide a metamaterial comprising a plurality of metamaterial repeat units containing a surface-patterned nanoparticle or microparticle that is coated with a metal in a surface pattern. The surface-patterned particle may include a dielectric material or a semiconductor material partially or fully coated with metal(s). In some embodiments, the surface-patterned particles are split ring resonators. Some variations provide a method of making a metamaterial, the method comprising: metallizing surfaces of particles, wherein particles are coated with metal(s) in a surface pattern; dispersing surface-patterned particles in a liquid solution at a starting pH; introducing a triggerable pH-control substance capable of generating an acid or base; and triggering the pH-control substance to generate an acid or base, thereby adjusting the solution pH to a titrated pH. The zeta potential is closer to zero at the titrated pH compared to the starting pH, causing the surface-patterned particles to assemble into a metamaterial.

20 Claims, 8 Drawing Sheets

Related U.S. Application Data

(60) Provisional application No. 62/548,884, filed on Aug. 22, 2017, provisional application No. 62/213,044, filed on Sep. 1, 2015, provisional application No. 62/212,969, filed on Sep. 1, 2015.

(51) Int. Cl.
| | |
|---|---|
| *G02B 1/00* | (2006.01) |
| *G02F 1/065* | (2006.01) |
| *B82Y 40/00* | (2011.01) |
| *B82Y 30/00* | (2011.01) |

(52) U.S. Cl.
CPC ......... *G02B 6/29338* (2013.01); *G02F 1/065* (2013.01); *B82Y 30/00* (2013.01); *B82Y 40/00* (2013.01); *G02F 2202/30* (2013.01)

(56) References Cited

U.S. PATENT DOCUMENTS

| | | | |
|---|---|---|---|
| 6,506,264 B1 | 1/2003 | Hisano et al. | |
| 8,475,869 B2 | 7/2013 | Badre et al. | |
| 9,695,468 B2* | 7/2017 | Hindson | ............ C12Q 1/6806 |
| 2002/0160195 A1* | 10/2002 | Halas | ................. B22F 1/02 |
| | | | 428/403 |
| 2003/0022242 A1 | 1/2003 | Anderson | |
| 2005/0009079 A1 | 1/2005 | Anders et al. | |
| 2009/0098366 A1 | 4/2009 | Smoukov et al. | |
| 2013/0101848 A1* | 4/2013 | Banerjee | ............. C09K 11/691 |
| | | | 428/402 |

OTHER PUBLICATIONS

Barnov et al., "Chemically induced self-assembly of spherical and anisotropic inorganic nanocrystals," J. Mater. Chem. 2011, 21, 16694.

Baranov et al., "Assembly of Colloidal Semiconductor Nanorods in Solution by Depletion Attraction," Nano Lett. 2010, 10, 743-749.

Teh et al., "Droplet microfluidics," Lab Chip, 2008, 8, 198-220.

Ahmed et al., "Centimetre scale assembly of vertically aligned and close packed semiconductor nanorods from solution," Chemical Communications, (42): 6421-6423, Sep. 8, 2009.

Fang et al., "pH-Induced Simultaneous Synthesis and Self-Assembly of 3D Layered β-FeOOH Nanorods," Langmuir 2010, 26(4), 2745-2750.

Han et al., "Synthesis and magnetic properties of single-crystalline magnetite nanowires," Journal of Crystal Growth 307 (2007) 483-489.

Singh et al., "Controlled semiconductor nanorod assembly from solution: influence of concentration, charge and solvent nature," J. Mater. Chem., 2012, 22, 1562.

Singh et al., "Insight into the 3D Architecture and Quasicrystal Symmetry of Multilayer Nanorod Assemblies from MoiréInterference Patterns," ACS Nano vol. 6 No. 4 3339-3345, 2012.

Singh et al., "Assembly of CuIn1-xGaxS2 Nanorods into Highly Ordered 2D and 3D Superstructures," ACS Nano vol. 6 No. 8 6977-6983, 2012.

Talapin et al., "A New Approach to Crystallization of CdSe Nanoparticles into Ordered Three-Dimensional Superlattices," Adv. Mater 2001, 13, No. 24, Dec. 17.

Varanda et al., "Structural and magnetic transformation of monodispersed iron oxide particles in a reducing atmosphere," Journal of Applied Physics vol. 92, No. 4 Aug. 15, 2002.

Vivas et al., "Magnetic anisotropy in ordered textured Co nanowires," Applied Physics Letters 100, 252405 (2012).

Wang et al., "Self-Assembled Colloidal Superparticles from Nanorods," Science Oct. 19, 2012 vol. 338.

Zanella et al., "Self-Assembled Multilayers of Vertically Aligned Semiconductor Nanorods on Device-Scale Areas," Adv. Mater. 2011, 23, 2205-2209.

Zhuang et al., "Cylindrical Superparticles from Semiconductor Nanorods," J. Am. Chem. Soc. 2009, 131, 6084-6085.

Chao et al., "Millimeter Wave Hexagonal Nano-Ferrite Circulator on Silicon CMOS Substrate" Microwave Symposium (IMS), 2014 IEEE MTT-S International.

Kotov et al., "Layer-by-Layer Self-Assembly of Polyelectrolyte-Semiconductor Nanoparticle Composite Films" J. Phys. Chem. 1995, 99, 13065-13069.

\* cited by examiner

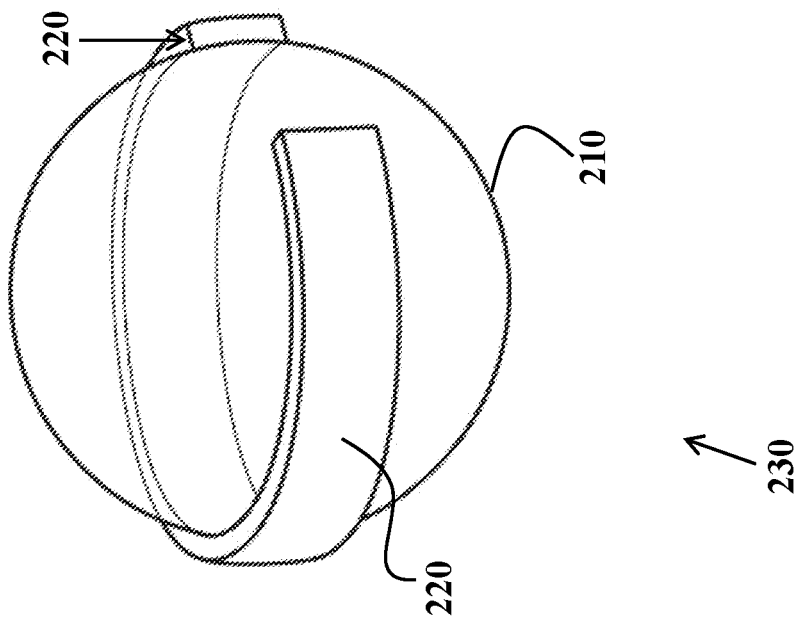
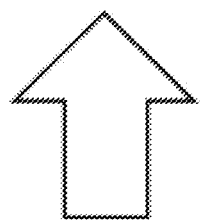
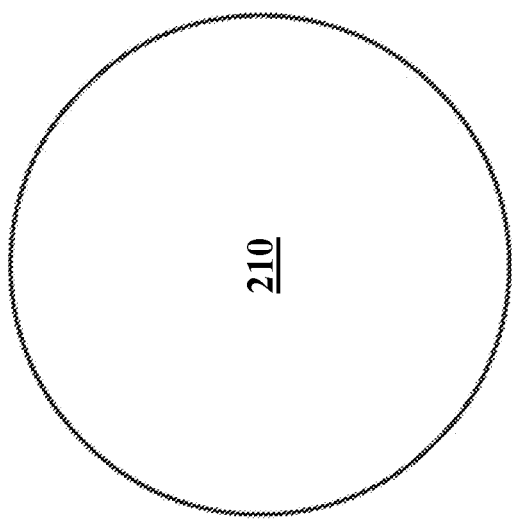
FIG. 2

METHODS FOR CHARGE-TITRATING ASSEMBLY OF PARTIALLY METALLIZED NANOPARTICLES, AND METAMATERIALS PRODUCED THEREFROM

PRIORITY DATA

This patent application is a non-provisional application claiming priority to U.S. Provisional Patent App. No. 62/548,884, filed Aug. 22, 2017, which is hereby incorporated by reference herein. This patent application is also a continuation-in-part of U.S. patent application Ser. No. 15/241,536, filed Aug. 19, 2016, which is hereby incorporated by reference herein.

STATEMENT REGARDING FEDERALLY SPONSORED RESEARCH OR DEVELOPMENT

This invention was made with Government support under DARPA Contract No. FA8650-15-C-7549. The Government has certain rights in this invention.

FIELD OF THE INVENTION

The present invention generally relates to structures and materials containing nanostructured assemblies (such as metamaterials), and methods of fabricating such assemblies.

BACKGROUND OF THE INVENTION

A metamaterial is a material engineered to have a property that is not found in nature. Metamaterials are usually made from assemblies of multiple repeat units fabricated from composite materials such as metals or plastics. The size, geometry, orientation, and arrangement of metamaterials enable manipulation of electromagnetic waves by blocking, absorbing, enhancing, or bending waves. Appropriately designed metamaterials can affect waves of electromagnetic radiation (e.g., UV, visible, and IR) or sound in a manner not observed in bulk materials. Potential applications of UV, visible, and IR metamaterials are diverse and include compact optics, optical filters, remote aerospace applications, sensor detection and infrastructure monitoring, solar power management, radomes, high-frequency battlefield communication and lenses for high-gain antennas, ultrasonic sensors, IR-absorbing and optical-absorbing materials, cloaking, angle-tunable optics, IR/thermal radiation control, and more.

There is an interest in metamaterials that incorporate individual nanoparticles as repeat units. Individual nanoparticles possess size-tunable magnetic, optical, mechanical, electrical, or catalytic properties. However, incorporating nanoparticles in macroscopic structures typically involves either encasing them in a matrix that dilutes their magnetic, electrical, or optical properties, or sintering them together and thus losing their size-dependent properties. While existing methods can assemble nanoparticles through controlling attractive and/or repulsive interparticle forces, there is a need for a method that is organic-free, rapid, scalable to large areas, and applicable to a wide range of materials and nanoparticle shapes.

Tightly packed, organic-free arrays of nanoparticles are useful for optical, magnetic, and electronic device applications. There is a desire for nanostructures with strong magnetic and/or electric dipole resonances at optical frequencies. Nanostructures containing tightly packed, yet distinct (not agglomerated) nanoparticles are sought. The nanoparticles need to remain distinct to maintain the beneficial properties arising from the nanoscale dimensions.

There are existing approaches for forming packed nanoparticles, but they do not form these assemblies in solution without organic ligands. That is, arrays of nanoparticles from crystallization methods are usually surrounded by organic ligands that interfere with further chemical processing and can limit durability. Organic ligands typically melt from heat and darken in the presence of light. This lack of thermal and optical stability makes avoiding organic ligands crucial for environmentally robust structures.

Agglomerated nanoparticles may be formed without organic ligands by adjusting the pH of a solution of dispersed nanoparticles with an acid or base solution to near the isoelectric point of the nanoparticles. However, these nanoparticles will not be tightly packed.

Nanoparticles may be formed in an array requiring a substrate. In these approaches, nanoparticles are packed via drying from a solution (colloidal crystals) or electrophoresis, both requiring a substrate. Colloidal crystals are formed by dispersing colloids in a solution and drying on a substrate or spin coating on a substrate. Moreover, electrophoresis does not always result in tightly packed nanoparticles.

Arrays of nanoparticles may be grown in an array on a substrate from a process with gaseous reactants. Arrays of nanoparticles may be formed through a wet chemical process. In one approach, metals or oxides are deposited in the pores of anodic alumina or mesoporous silica. This approach forms either single layers of nanorods or nanorods that have empty space between them and no material between the rods. This results in a low density of material and reduced efficacy from the array.

The packed arrays of nanoparticles, as taught in the prior art, tend to be non-uniform in array size and shape. In order to be useful in larger devices, arrays of assembled particles should be uniform in size and shape. This is necessary for either bottom-up assembly processes, such as self-assembly into larger assemblies; for top-down assembly processes, such as pick-and-place assembly onto patterned substrates; or for combinations of bottom-up and top-down assembly.

In view of the aforementioned art, what is needed is a material-agnostic, organic ligand-free, and matrix-free assembly method to create metamaterials containing separately synthesized nanoparticles.

SUMMARY OF THE INVENTION

The present invention addresses the aforementioned needs in the art, as will now be summarized and then further described in detail below.

Some variations provide a method of making a metamaterial, the method comprising:

(a) providing a plurality of particles;

(b) metallizing surfaces of the particles, wherein at least some of the particles are coated with one or more metals in a surface pattern, thereby generating surface-patterned particles;

(c) dispersing a plurality of the surface-patterned particles in a liquid solution characterized by a solution pH, wherein the surface-patterned particles are characterized by an average zeta potential, and wherein the solution pH is at a starting pH;

(d) introducing to the liquid solution before, during, or after the surface-patterned particles are dispersed in the liquid solution, a triggerable pH-control substance capable of generating an acid or a base when triggered; and (e) triggering the pH-control substance to generate an acid or a base within the volume of liquid solution, thereby adjusting the solution pH from the starting pH to a titrated pH, wherein the average zeta potential is closer to zero at the titrated pH compared to the starting pH, causing the surface-patterned particles to assemble into a metamaterial.

In some embodiments, the particles are characterized by an average particle size from about 1 nanometer to about 100 microns. In certain embodiments, the particles are characterized by an average particle size from about 50 nanometers to about 1 micron.

The particles may comprise a dielectric material, a semiconductor material, or a combination thereof, for example. In various embodiments, the particles comprise a material selected from the group consisting of oxides, sulfides, phosphides, selenides, tellurides, fluorides, arsenides, silicon, and combinations thereof.

The one or more metals (on the surface of the particles) may be selected from the group consisting of gold, silver, copper, nickel, aluminum, and combinations thereof. The surface-patterned particles may be partially coated with the one or more metals, or the surface-patterned particles may be fully coated with the one or more metals in a pattern.

In some embodiments, the surface-patterned particles are ring resonators. In some embodiments, the surface-patterned particles are split ring resonators.

The liquid solution may comprise one or more compounds selected from the group consisting of water, dimethyl formamide, dimethylsulfoxide, isopropanol, acetone, tetrahydrofuran, and combinations thereof. The method may further comprise introducing, to the liquid solution, an anion dispersal agent such as (but not limited to) borofluoride anions, thiocyanate anions, or a combination thereof.

In some embodiments, the pH-control substance is triggered with electromagnetic radiation to generate the acid or the base. In certain embodiments, the pH-control substance is a photoacid generator or a photobase generator. The pH-control substance may be selected from the group consisting of sodium tetraphenylborate, (4-fluorophenyl)diphenylsulfonium triflate, 2-(9-oxoxanthen-2-yl)propionic acid 1,5,7-triazabicyclo[4.4.0]dec-5-ene, and combinations thereof.

In some embodiments, the pH-control substance is triggered with a change in temperature, to generate the acid or the base. The pH-control substance may include urea, carbon dioxide, or a combination thereof.

In some embodiments, the pH-control substance is an acid gas selected from the group consisting of $CO_2$, $H_2S$, COS, $SO_2$, $SO_3$, NO, $NO_2$, $N_2O$, HCl, HF, HBr, $BCl_3$, $BF_3$, $Cl_2$, $SiCl_2H_2$, HI, $CH_3COOH$, HCOOH, and combinations thereof.

In some embodiments, the pH-control substance is an alkaline gas selected from the group consisting of $NH_4$, monomethylamine, diethylamine, trimethylamine, other amines containing one or more alkyl or aryl groups, and combinations thereof.

The pH-control substance may be triggered uniformly in space within the volume of liquid solution. Alternatively, the pH-control substance may be triggered in a spatial pattern within the volume of liquid solution. Alternatively, or additionally, the pH-control substance may be triggered at temporally varying trigger intensity.

The titrated pH is preferably within about 1.0 pH units of the average isoelectric point of the surface-patterned particles. The magnitude of rate of change of the solution pH, measured at the titrated pH, is preferably about 0.02 pH units per minute, or less. The magnitude of the average zeta potential is preferably about 10 mV, or less, at the titrated pH compared to the starting pH. The magnitude of the average zeta potential preferably changes at a rate from about 1 mV/hr to about 50 mV/hr during adjusting solution pH from the starting pH to a titrated pH.

Variations of the present invention also provide a metamaterial comprising a plurality of metamaterial repeat units, wherein each of the metamaterial repeat units comprises a surface-patterned particle that is a base particle coated with one or more metals in a surface pattern, and wherein the surface-patterned particle is characterized by an average particle size from about 1 nanometer to about 100 microns.

In some metamaterials provided herein, the surface-patterned particle is characterized by an average particle size from about 50 nanometers to about 1 micron. The surface-patterned particle may have a geometry selected from the group consisting of round, cylindrical, elliptical, cubic, diamond-shaped, bipyramidal, hexagonal prism, and combinations thereof.

In some metamaterials, the base particle comprises a dielectric material, a semiconductor material, or a combination thereof. In certain embodiments, the base particle comprises a material selected from the group consisting of oxides, sulfides, phosphides, selenides, tellurides, fluorides, arsenides, silicon, and combinations thereof.

The one or more metals may be selected from the group consisting of gold, silver, copper, nickel, aluminum, and combinations thereof. The surface-patterned particle (metamaterial repeat unit) may be partially coated or fully coated with the one or more metals.

In some metamaterial embodiments, the surface-patterned particles are ring resonators and/or split ring resonators.

The overall metamaterial may be a periodic three-dimensional array of the metamaterial repeat units (e.g., see FIG. 3). In some embodiments, the metamaterial repeat units have a packing density of at least 50 vol % within the metamaterial. The metamaterial may contains at least $10^3$ of the metamaterial repeat units, or least $10^6$ of the metamaterial repeat units, for example.

Preferably, the metamaterial is essentially free of organic molecules chemically bonded or physically adsorbed to the surface-patterned particles.

The metamaterial may be disposed on a substrate. For example, the metamaterial may be present as a photonic component in a photonic microsystem that includes the substrate (e.g., see FIG. 5).

In other embodiments, the metamaterial is not disposed on a substrate (e.g., see FIG. 1). In some embodiments, the metamaterial repeat units contain cylindrical or ellipsoidal structures with an average length-to-width ratio of about 1.5 or higher. The cylindrical or ellipsoidal structures are preferably characterized by a full width at half maximum angular distribution of the axial direction of about ±20° or less. The cylindrical or ellipsoidal structures are preferably characterized by an average center-to-center distance between adjacent cylindrical or ellipsoidal structures of less than 1.5 times the average width of the cylindrical or ellipsoidal structures. In some preferred embodiments, at least a portion of the cylindrical or ellipsoidal structures are aligned in one axial direction, wherein the cylindrical or ellipsoidal structures are packed together and touching in an end-to-end stacked array.

The metamaterial may be present in a system selected from the group consisting of photonic systems, magnets, optical devices, optical filters, optical-absorbing systems, cloaking systems, electronic devices, electrochemical systems, and computers.

BRIEF DESCRIPTION OF THE DRAWINGS

FIG. 2 is a depiction of an exemplary surface-patterned particle in the form of a split ring resonator, in certain embodiments.

DETAILED DESCRIPTION OF EMBODIMENTS OF THE INVENTION

Figure 1:
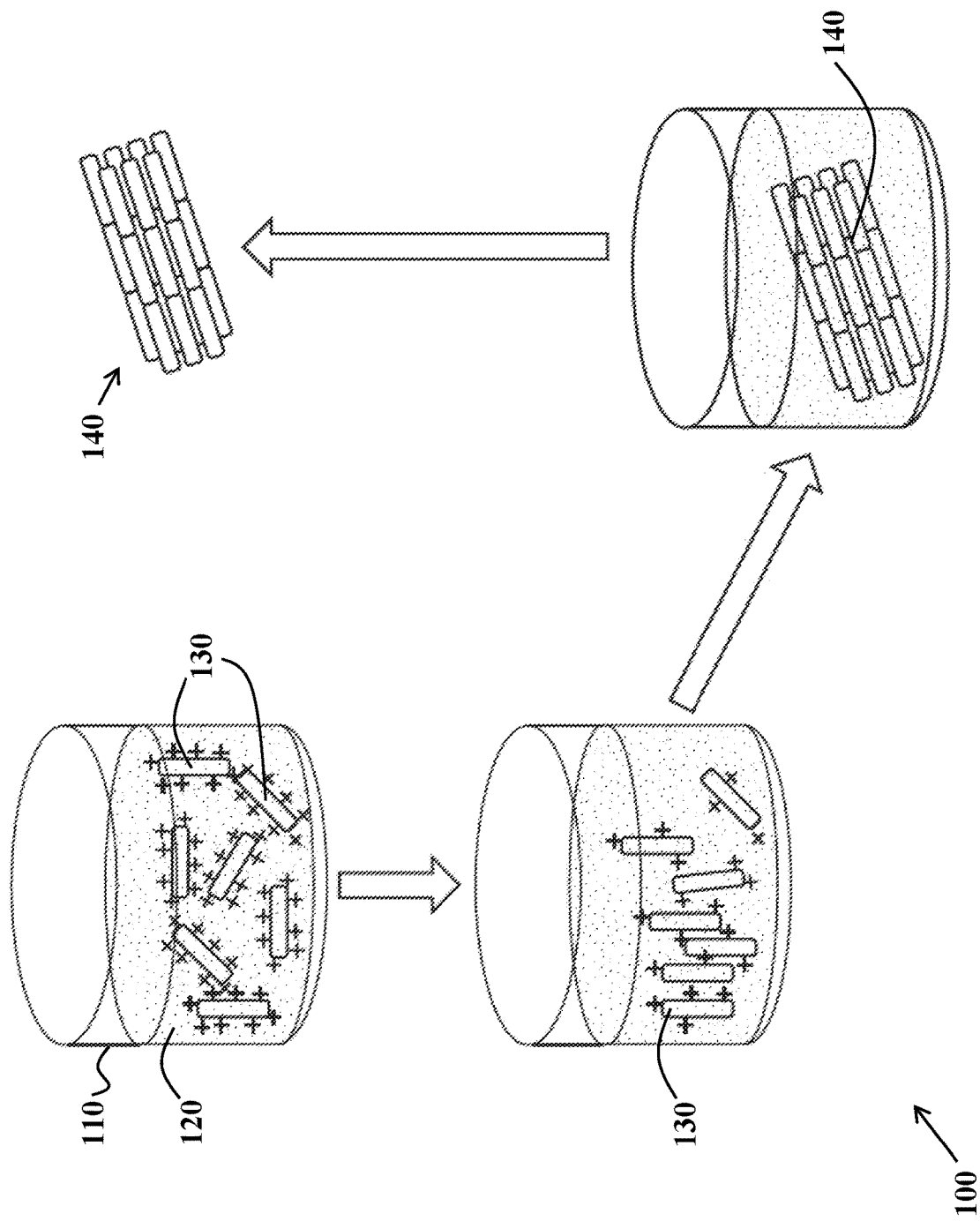
FIG. 1 is a schematic diagram of a method to form assembled particles, according to some embodiments.

The compositions, structures, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms, except when used in Markush groups. Thus in some embodiments not otherwise explicitly recited, any instance of "comprising" may be replaced by "consisting of" or, alternatively, by "consisting essentially of."

Variations of the present invention are premised on the assembly of nanoparticles or microparticles into an assembly, where each of the nanoparticles or microparticles has a metal pattern on its surface. Variations of the invention provide a method to assemble particles with metal patterns on their surfaces into tightly packed assemblies or arrays. This method utilizes charge-titrating assembly with spatial and temporal control over the zeta potential of the particles to achieve alignment and organization of particles, without requiring organic ligands, and with or without a substrate.

Variations provide metamaterials containing durable, thermally stable, and non-photodarkening packed nanoparticles or microparticles that are surface-patterned with one or more metals. By applying metal to the surfaces of nanoparticles or microparticles prior to assembly of the nanoparticles or microparticles, metal features are created on the length scales necessary for functional metamaterials.

Compared to pure dielectric nanoparticles, even greater functionality is realized by starting with nanoparticles that have metal patterns on their surfaces. For instance, dielectric nanoparticles (e.g., in the 100-1000 nm size range) may have metallic split ring resonators patterned on their surfaces. The assembly of such surface-patterned particles into a tightly packed array creates an optical metamaterial that is functional in the UV, visible, or IR spectrum, depending on the nanoparticle size and split ring resonator dimensions.

By assembling a metamaterial from nanoparticles (bottom-up fabrication) instead of lithographically defining a metamaterial (top-down), a number of exemplary benefits are realized. First, it is easier to create a 3D structure with bottom-up assembly compared to top-down lithography which requires many iterations of a 2D planar process to build up to three dimensions. Second, it is easier to assemble nanoparticles onto curved structures. Third, functional oxides (e.g. Ti-doped $LiYF_4$), which are very challenging to vacuum deposit, can be incorporated into the structure through solution processing. This approach enables incorporation of an optical gain medium into the structure, which can help mitigate optical power losses inherent in plasmonic metamaterials, for example.

This specification hereby incorporates by reference commonly owned U.S. patent application Ser. No. 15/795,346, filed on Oct. 27, 2017; U.S. patent application Ser. No. 15/241,536, filed on Aug. 19, 2016; and U.S. patent application Ser. No. 15/241,661, filed on Aug. 19, 2016 (now allowed), as pertaining to some embodiments of this invention.

Variations of the present invention provide a metamaterial comprising a plurality of metamaterial repeat units, wherein each of the metamaterial repeat units comprises a surface-patterned particle that is a base particle coated with one or more metals in a surface pattern, and wherein the surface-patterned particle is characterized by an average particle size from about 1 nanometer to about 100 microns.

The surface-patterned particle (metamaterial repeat unit) may be partially coated or fully coated with the one or more metals. In a partially coated particle, at least some of the particle surface is not covered by metals. In a fully coated particle, essentially the entire particle surface is coated with one or more metals. Whether the particle is partially coated or fully coated, the metal coating forms a pattern on the surface, forming a surface-patterned particle.

As intended herein, a "surface-patterned particle" means that the particle has a metal coating in the form of a pattern. A "pattern" refers to a discernible regularity of metal particles on the surface, or one or more non-random surface features fabricated from metal particles. A pattern may or may not include repeating features in a predictable manner. For example, a pattern may include a single split ring on a particle or may include many rings on a single particle. The pattern itself may be uniform or non-uniform, but is not random.

A "metamaterial" is a two-dimensional array or three-dimensional array of surface-patterned particles. An exemplary two-dimensional array is a surface layer of surface-patterned particles on an underlying substrate or other material. An exemplary three-dimensional array is a cubic or spherical volume of surface-patterned particles. The metamaterial repeat unit is typically one surface-patterned particle (e.g., FIG. 3). In some cases, the metamaterial repeat unit contains two or more surface-patterned particles, for geometry reasons.

In some metamaterials provided herein, the surface-patterned particle is characterized by an average particle size from about 1 nanometer to about 100 microns, such as from about 50 nanometers to about 1 micron. In various embodiments, the surface-patterned particle is characterized by an average particle size of about 10, 25, 50, 100, 200, 300, 400, 500, 600, 700, 800, or 900 nanometers or about 1, 2, 5, 10, 20, 30, 40, 50, 60, 70, 80, or 90 microns. In some embodiments, the ratio between the shortest and longest dimension of the particle is from about 1:1 to about 1:5.

In some preferred embodiments, at least some of the particles are nanoparticles, which may be construed to mean particles having a particle size or at least one dimension below 1 micron. In certain preferred embodiments, all of the particles are nanoparticles, prior to array formation. Much of the remaining disclosure will assume that the particles are nanoparticles, it being understood that the principles of the invention may be applied to microparticles (particles having a particle size of 1 micron or higher) as well.

Particles sizes may be measured by a variety of techniques, including dynamic light scattering, laser diffraction, image analysis, or sieve separation, for example. Dynamic light scattering is a non-invasive, well-established technique for measuring the size and size distribution of particles typically in the submicron region, and with the latest technology down to 1 nanometer. Laser diffraction is a widely used particle-sizing technique for materials ranging from hundreds of nanometers up to several millimeters in size. Exemplary dynamic light scattering instruments and laser diffraction instruments for measuring particle sizes are available from Malvern Instruments Ltd., Worcestershire, UK. Image analysis to estimate particle sizes and distributions can be done directly on photomicrographs, scanning electron micrographs, or other images. Finally, sieving is a conventional technique of separating particles by size.

The particles may be symmetric or asymmetric. If the particles are asymmetric, the long axes of individual particles are preferably aligned in the same direction with respect to one another in the arrays. "Aligned" in this sense means that the long axis of the particles has a full width at half maximum angular distribution with respect to the array alignment direction of at most about ±20°, more preferably at most about ±10°, and most preferably at most about ±5°.

An "array" or equivalently "assembly" or "packed structure" as intended herein, means a plurality of particles that are packed together and touching or near touching in the end-to-end direction. In the array, the center-to-center distance between particles, in the width (not length) direction, is preferably less than the width of two particles. More preferably, the center-to-center distance between particles is less than the width of 1.5 particles.

The particles may form multilayer packed structures/arrays in solution. "Multilayer" means at least 2 layers, preferably at least 4 layers, more preferably at least 10 layers, and even more preferably at least 25 layers. Each layer is counted along a continuous layer of particles. Although particles preferably assemble into layers within the array, in some embodiments particles are assembled into a three-dimensional array without distinct layers in one or more of the dimensions.

The surface-patterned particle may have a geometry selected from the group consisting of round, cylindrical, rod-like (e.g., nanorods), elliptical, cubic, diamond-shaped, bipyramidal, hexagonal prism, and combinations thereof. In some embodiments, solid (not hollow) particles are employed. In other embodiments, hollow particles are employed.

In some metamaterials, the base particle comprises a dielectric material, a semiconductor material, or a combination thereof. In certain embodiments, the base particle comprises a material selected from the group consisting of oxides, sulfides, phosphides, selenides, tellurides, fluorides, arsenides, silicon, and combinations thereof. Note that "oxides" also includes hydroxides and oxyhydroxides. In some embodiments, the base particles include or consist essentially of fluorides, such as $LiYF_4$.

In some embodiments, the particles contain a core of a metal and a shell that is or includes an oxide, fluoride, sulfide, or combination thereof. The metal is distinct from the metal that forms the surface pattern, although the metals may compositionally be the same. In these or other embodiments, the particles contain a core of polymer and a shell that is or includes an oxide, fluoride, sulfide, or combination thereof. In these or other embodiments, the particles contain a core of a ceramic (or ceramic with metal) and a shell that is or includes an oxide, fluoride, sulfide, or combination thereof. The oxide, fluoride, or sulfide may be metal oxides, metal fluorides, metal sulfides, or another material (e.g., polymer or ceramic) in oxide, fluoride, or sulfide form. The oxide, fluoride, or sulfide may be present as carbon-free O-containing groups, carbon-free F-containing groups, or carbon-free S-containing groups, respectively, chemically bonded to the particle core.

The one or more metals for the surface pattern may be selected from the group consisting of gold, silver, copper, nickel, aluminum, and combinations thereof. In some embodiments, the metals are non-magnetic. As stated above, multiple metals may be employed. For example, the surface pattern may include primarily aluminum with silver lines forming surface features.

Many types of surface patterns may be employed. The surface pattern itself may be periodic, such as an array of dots or lines. The surface pattern may consist essentially of a single feature, such as a full ring or a split ring. The surface pattern may include concentric circles emanating from a dot or region. Intersecting or non-intersecting circles may be included on a particle surface. A spiral pattern may be included on a cylindrical particle surface. Zig-zag patterns may be included on the particles. In certain embodiments, surface fractal patterns are utilized. Fractal patterns may be generated using an algorithm.

In some embodiments, the particle has a continuous physical coating with a concentration gradient in the surface dimension, forming a pattern. In some embodiments, the pattern is in the form of surface-disposed wires that are either fully embedded in the particle surface, stick out to some extent, or are disposed on the surface and physically touching it but not embedded within the particle bulk phase.

The surface pattern may include patterned variations in surface roughness, porosity, material density, optical density, or other physical properties. Generally speaking, the surface-patterned particle is not merely a particle with a fully continuous coating of a single metal of one chemical and physical composition.

The surface-patterned particles are microresonators or nanoresonators, in some embodiments. In these or other metamaterial embodiments, the surface-patterned particles include split ring resonators. In some metamaterial embodiments, the surface-patterned particles include ring resonators, such as optical ring resonators. Note that in these embodiments, each particle is a resonator, to be distinguished from many particles being assembled into a single resonator that is much larger than individual particles.

A split ring resonator can produce magnetic susceptibility (magnetic response), providing strong magnetic coupling to an applied electromagnetic field, such as (but not limited to) infrared, visible, or ultraviolet frequencies. For example, an effect such as negative permeability may be produced with a periodic array of split ring resonators. In some embodiments, the split ring resonator includes a single ring of metal with a gap, as depicted in FIG. 2. In other embodiments, a pair of rings is included, with gaps typically at opposite ends of the rings. The ring(s) may be concentric or non-concentric. A magnetic flux penetrating the metal ring(s) induces rotating currents in the rings, which produce their own flux to enhance or oppose the incident field.

An optical ring resonator includes a closed ring coupled to some sort of light input and output. When light of a resonant wavelength is passed through an optical ring resonator from an input waveguide, it builds up in intensity over multiple round trips due to constructive interference. In some embodiments, because only some wavelengths will be at resonance within the loop, the optical ring resonator functions as a filter. Multiple closed rings may be included on each particle.

Variations of the above may be employed in other types of resonators. For example, the surface-patterned particles may be split-ball resonators in which metal features are patterned into the depth of the particle, in addition to forming a surface pattern. Split-ball resonators can provide hybrid resonant modes, for example.

In any of the above-described surface patterns, a wide range of surface feature sizes may be employed, depending on the desired metamaterial properties. Surface feature sizes may refer to sizes of dots, line widths, line lengths, dimensions between adjacent features, or dimensions associated with a gap within a line (e.g., the gap size in a split ring), for example. The surface feature dimensions are on the order of the particle size itself, or less. For example, in the case of particle with diameter of 1 micron, the surface pattern may have characteristic dimensions of about 0.1-1 microns or about 1-900 nanometers, as examples.

In general, with particles in the size range of 1 nm to 100 microns, the surface patterns may have characteristic dimensions from about 0.1 nanometers to about 100 microns, such as about 0.5, 1, 2, 5, 10, 20, 30, 40, 50, 100, 200, 300, 400, 500, 600, 700, 800, or 900 nanometers, and/or about 1, 2, 3, 4, 5, 10, 20, 30, 40, 50, 60, 70, 80, or 90 microns.

Multiple coating layers may be employed to alter electromagnetic properties of the particle. A particle with alternating substrate (e.g. semiconductor) layers and metal layers may be employed.

Figure 3:
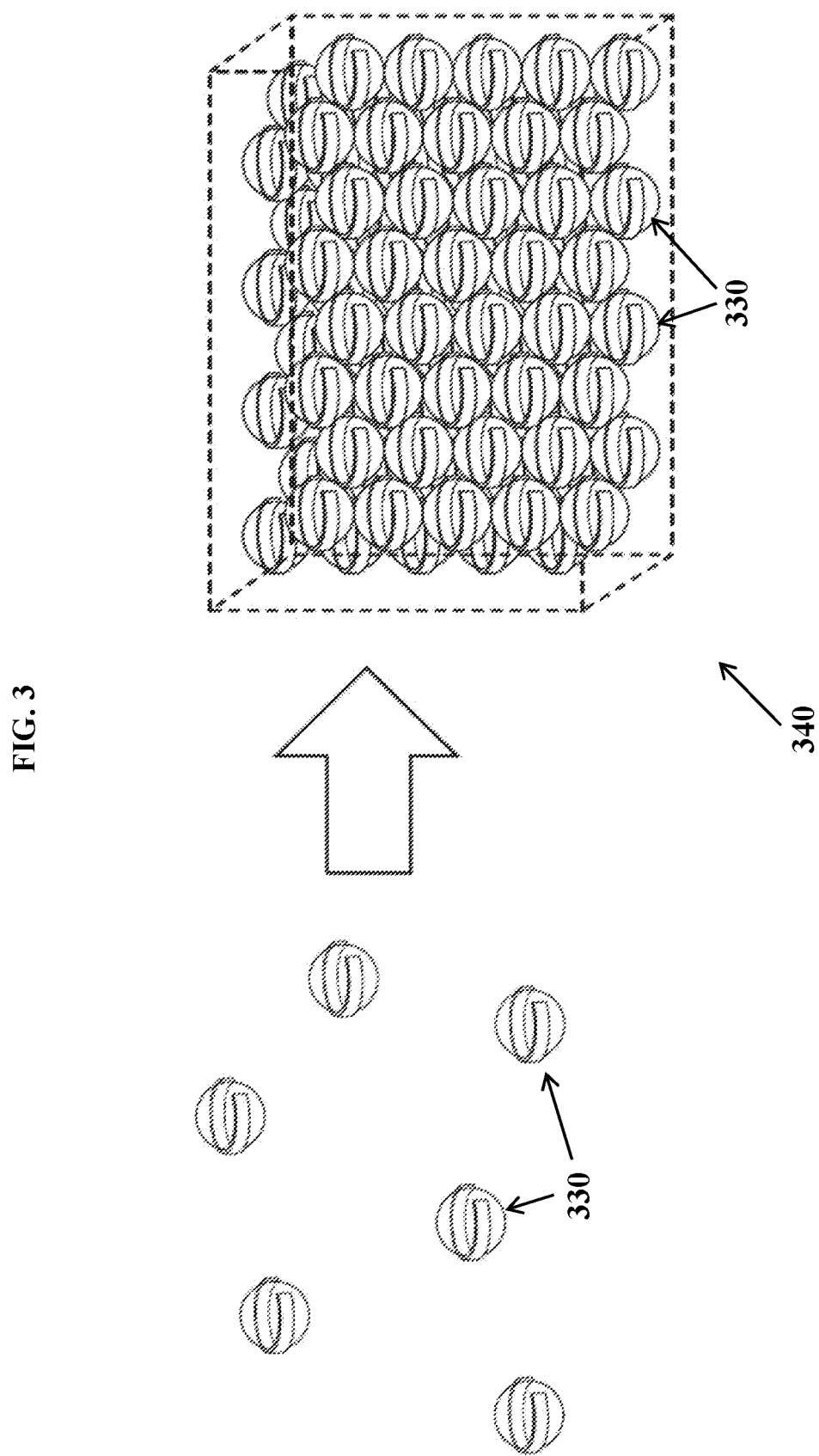
FIG. 3 is a depiction of partially metallized nanoparticles assembled into a metamaterial, in certain embodiments.

The overall metamaterial may be a periodic three-dimensional array of the metamaterial repeat units (e.g., see FIG. 3). In some embodiments, the metamaterial repeat units have a packing density of at least 50 vol % within the metamaterial. The metamaterial may contains at least $10^3$ of the metamaterial repeat units, or least $10^6$ of the metamaterial repeat units, for example.

Preferably, the metamaterial is essentially free of organic molecules chemically bonded or physically adsorbed to the surface-patterned particles.

The metamaterial may be disposed on a substrate. For example, the metamaterial may be present as a photonic component in a photonic microsystem that includes the substrate (e.g., see FIG. 5).

In other embodiments, the metamaterial is not disposed on a substrate (e.g., see FIG. 1). In some embodiments, the metamaterial repeat units contain cylindrical or ellipsoidal structures with an average length-to-width ratio of about 1.5 or higher. The cylindrical or ellipsoidal structures are preferably characterized by a full width at half maximum angular distribution of the axial direction of about ±20° or less. The cylindrical or ellipsoidal structures are preferably characterized by an average center-to-center distance between adjacent cylindrical or ellipsoidal structures of less than 1.5 times the average width of the cylindrical or ellipsoidal structures. In some preferred embodiments, at least a portion of the cylindrical or ellipsoidal structures are aligned in one axial direction, wherein the cylindrical or ellipsoidal structures are packed together and touching in an end-to-end stacked array.

Some variations provide a method to assemble particles (which may be symmetric or asymmetric) into tightly packed structures or arrays. The method preferably employs spatial and temporal control over the zeta potential of the particles in a parallel manner to achieve alignment and organization of particles, without organic ligands—thereby creating durable, highly thermally stable, and non-photo-darkening packed nanoparticles.

Generally speaking, methods of the invention may employ charge-titrating particle assembly. By "charge-titrating particle assembly" is meant the assembly of particles contained, along with a solvent, in bulk solution, preferably with spatial and/or temporal control over the zeta potential of the particles to achieve alignment and organization of particles. Preferably, the assembly of particles does not employ organic ligands on the particles themselves ("organic" means containing carbon). Furthermore, charge-titrating particle assembly itself does not require a substrate.

Some variations provide a method of making a metamaterial, the method comprising:

(a) providing a plurality of particles;

(b) metallizing surfaces of the particles, wherein at least some of the particles are coated with one or more metals in a surface pattern, thereby generating surface-patterned particles;

(c) dispersing a plurality of the surface-patterned particles in a liquid solution characterized by a solution pH, wherein the surface-patterned particles are characterized by an average zeta potential, and wherein the solution pH is at a starting pH;

(d) introducing to the liquid solution before, during, or after the surface-patterned particles are dispersed in the liquid solution, a triggerable pH-control substance capable of generating an acid or a base when triggered; and (e) triggering the pH-control substance to generate an acid or a base within the volume of liquid solution, thereby adjusting the solution pH from the starting pH to a titrated pH, wherein the average zeta potential is closer to zero at the titrated pH compared to the starting pH, causing the surface-patterned particles to assemble into a metamaterial.

In some embodiments, nanoparticles are partially coated with metal (e.g., Au, Ag, and/or Al) in a surface pattern. The metal patterns may be, for example, split ring resonators, essentially a loop of metal that has a gap in it. There may be multiple split rings on each particle. Multiple split rings are preferably orientated in planes with different angles, more preferably are oriented in orthogonal directions, and most preferably oriented in three orthogonal directions. In some embodiments, metal patterns include features with tips (e.g., crosses) wherein tips of adjacent features are aligned, but not touching.

The average metal coating thickness is preferably <50% of the average particle diameter, more preferably <20% of the average particle diameter, and most preferably <10% of the average particle diameter. Metal line widths are, on average, preferably <75% of the average particle diameter, more preferably <50% of the average particle diameter, and most preferably <20% of the average particle diameter.

A number of different processes may be employed to coat the particles with metal(s). Exemplary coating processes include, but are not limited to, electroless deposition, electroplating, metal evaporation, sputtering, metal organic chemical vapor deposition, or light-induced deposition. Electroless deposition is a preferred technique.

In certain embodiments, the particles are covered by an alkoxy silane coating that is degraded by exposure to UV light. The particles are first exposed to UV light to create areas for metal deposition and then metal is applied to individual particles, only adhering where the silane coating is not present. If the particle absorbs UV light, then a shaded region opposite the light source is created and this creates a gap in a metal band.

A number of processes may be used to achieve partial metal coverage. The particles may be masked during metal deposition, wherein particles are set partially into a photoresist layer, for example. The metal may be applied non-uniformly. For example, line-of-sight metal deposition from thermal evaporation may be employed, using glancing angle deposition and/or by rotating the particles (or a substrate holding the particles) through <360° particle rotation in a line-of-sight deposition process. The metal may be removed non-uniformly. For example, after deposition the metal may be removed with ion milling or reactive ion etching, leaving behind metal on the sides of the particle since only metal off the top of the particle is removed. A focused ion beam may remove some of the metal. A combination of processes may be used. For example, in certain embodiments, particles are held on a flat substrate with photoresist, and thermal evaporation through about 300° (angle) of the particle surface applies a partial metal shell to all the particles. Alternatively, or additionally, ion milling may remove metal from the tops of the particles, thus leaving a metal split ring around the middle of the particles.

The surface-patterned particles are then added to a liquid solution. Preferably, metal features (as described above) are already applied to the particles prior to assembly, thus enabling the arrangement of metal domains on dielectric and/or semiconducting substrates with sub-micron metal features.

The liquid solution may comprise one or more compounds selected from the group consisting of water, dimethyl formamide, dimethylsulfoxide, isopropanol, acetone, tetrahydrofuran, and combinations thereof. The method may further comprise introducing, to the liquid solution, an anion dispersal agent such as (but not limited to) borofluoride anions, thiocyanate anions, or a combination thereof, or other organic-free charged anions on the surface to help keep the particles dispersed in liquid solution. The liquid solution is preferably free of components that would form organic ligands on the particles.

Particles may be dispersed in liquid solution by adjusting the pH to increase the zeta potential to be above 20 mV or below −20 mV. The particles are preferably fully formed and not a solution of precursors such as metal salts that contain cations or anions that in aggregate match the composition of the particles. A salt such as NaCl, with cations or anions that are not common with the particle composition, may be added to change the screening of electrostatic charges in solution. Electrostatic repulsion prevents the particles from agglomerating. Brownian motion, sonication, and/or bulk mixing may be used to keep the particles suspended in solution.

A thermal or photoacid or photobase generator may be used as the pH-control substance and added to the liquid solution. For example, urea is a thermal base generator and creates base from exposure to temperatures above 50° C. Sodium tetraphenylborate is a photobase generator and creates hydroxide ions in response to UV light. (4-Fluorophenyl)diphenylsulfonium triflate is a photoacid generator and creates $H^+$ ions in response to UV light.

In some embodiments, the pH-control substance is an acid gas. Acid gases shift an acid-gas equilibrium in solution and thus change pH. Triggering the pH-control substance, when it is an acid gas, may be done by introducing the acid gas to solution, optionally with a change in another parameter such as temperature or pressure. In solution, at least some of the acid gas becomes a dissolved acid (i.e., the triggered acid in the method). A preferred acid gas, for safety reasons, is carbon dioxide ($CO_2$) or a gas containing diluted $CO_2$, such as in compressed dry air. Other acid gases that may be employed include, but are not limited to, $H_2S$, COS, $SO_2$, $SO_3$, NO, $NO_2$, $N_2O$, HCl, HF, HBr, $BCl_3$, $BF_3$, $Cl_2$, $SiCl_2H_2$, HI, $CH_3COOH$, HCOOH, or combinations thereof.

In some embodiments, the pH-control substance is an alkaline gas. Alkaline gases shift a base-gas equilibrium in solution and thus change pH. Triggering the pH-control substance, when it is an alkaline gas, may be done by introducing the alkaline gas to solution, optionally with a change in another parameter such as temperature or pressure. In solution, at least some of the alkaline gas becomes a dissolved base (i.e., the triggered base in the method). A preferred alkaline gas is ammonia ($NH_4$). Other alkaline gases that may be employed include, but are not limited to, amines, such as $R-NH_2$, $R_2-NH$, and/or $R_3-N$, wherein R is one or more alkyl or aryl groups, monomethylamine, diethylamine, trimethylamine, etc., and each R group (when two or more are present) may be independently selected.

A trigger is applied to begin the pH titration process. The trigger may be thermal, optical, electromechanical, or some other type of trigger. There may be more than one trigger source. If a trigger is thermal, the trigger source may be a resistive Joule heater (e.g. a pattern resistive element on the inside or outside wall of a reactor), a convective heater (e.g. another, hotter or colder fluid that passes through adjacent to the reaction region), a thermoelectric device or material, or an infrared heater, for example. If a trigger is optical or electromagnetic, the trigger may be a light-emitting diode, a laser, an ultraviolet lamp, an incandescent lamp, or a halogen lamp, for example.

As stated above, a trigger may be the introduction of an acid gas or alkaline gas into solution. In the case of an acid gas or an alkaline gas as a pH-control substance, steps (d) and (e) are simultaneous. That is, upon introducing (to the liquid solution) a triggerable pH-control substance capable of generating an acid or a base when triggered, the pH-control substance is immediately triggered to generate an acid or a base within the volume of liquid solution, adjusting the solution pH from the starting pH to a titrated pH, wherein the average zeta potential is closer to zero at the titrated pH compared to the starting pH, causing the surface-patterned particles to assemble into a metamaterial.

The trigger for the pH-control substance may be spatially patterned in the reaction region. For example, the trigger pattern may change on a length scale greater than a droplet size. Heat flux may be increased or decreased along a flow direction in the reaction region. In other embodiments, the trigger pattern changes on a length scale less than the droplet size. For instance, light may be patterned using optical interference to generate a spatially varying pattern at a fine length scale. Shadow masking may be employed. The trigger pattern may vary on multiple length scales.

In some embodiments, the trigger is patterned in time in the reaction region. For instance, an optical signal may be modulated to flash briefly as each particle passes by.

The liquid solution is then uniformly titrated in pH towards the isoelectric point by triggering the pH-control substance, to induce assembly. The pH is preferably not changed by adding acid or base solutions, because this will result in local pH gradients in the solution that will result in uncontrolled agglomeration instead of assembly of nanoparticles into tightly packed arrays.

If used, heating or light exposure preferably is stopped when the pH is within 1.5 pH units, more preferably within 1.0 pH units, of the isoelectric point and/or when the zeta potential of the particles is −10 mV<zeta potential <+10 mV.

The assembled particles are then separated from the solution. This separation may be done with centrifugation or filtration, for example. The assembled particles are optionally dried to remove any residual solution, and the assembled particles are isolated as a metamaterial.

FIG. 1 shows a schematic diagram of a method 100 to form assembled particles 140, according to the present invention. Rod-like particles 130 (e.g., nanorods) are added to a container 110 with liquid solution 120. The particles 130 may have a surface pattern of metal (not shown). A pH-control substance (not shown) is also present in the liquid solution 120. The charges of the particles 130 are decreased by applying a trigger, such as with heat or light, resulting in reduction average zeta potential being closer to zero. With gradual reduction in particle surface charge, particles align into an assembly 140 contained in liquid solution 120. The three-dimensional particle assembly 140 is removed from the container 110.

FIG. 2 depicts an exemplary surface-patterned particle 230 in the form of a split ring resonator. A particle 210 (shown here to be spherical, but not limited to that geometry) is partially coated with a metal 220, including a gap in the metal 220 loop, resulting in a surface-patterned particle 230. As an example, starting particle 210 may be a 100-nanometer-diameter laser glass nanocrystal, such as Ti-doped LiYF4. The metal 220 may be gold, for example. Surface-patterned particles 230 may be employed as the starting particles 130 in FIG. 1.

FIG. 3 depicts assembly of partially metallized nanoparticles 330 into an assembly (metamaterial) 340. The starting partially metallized nanoparticles 330 may be the same as the surface-patterned particles 230 depicted in FIG. 2. These partially metallized nanoparticles 330 may be present in a precursor solution that is subjected to charge-titrating particle assembly as described herein. The resulting metamaterial 340 is a period three-dimensional array of partially metallized nanoparticles 330, which in this case are split ring resonators. The metamaterial 340 therefore is a metamaterial photonic component that may be used for various purposes. The partially metallized nanoparticles 330 are repeat units of the metamaterial 340. The length or width of the overall metamaterial 340 may vary, such as from about 10 microns to about 1000 microns.

Figure 4:
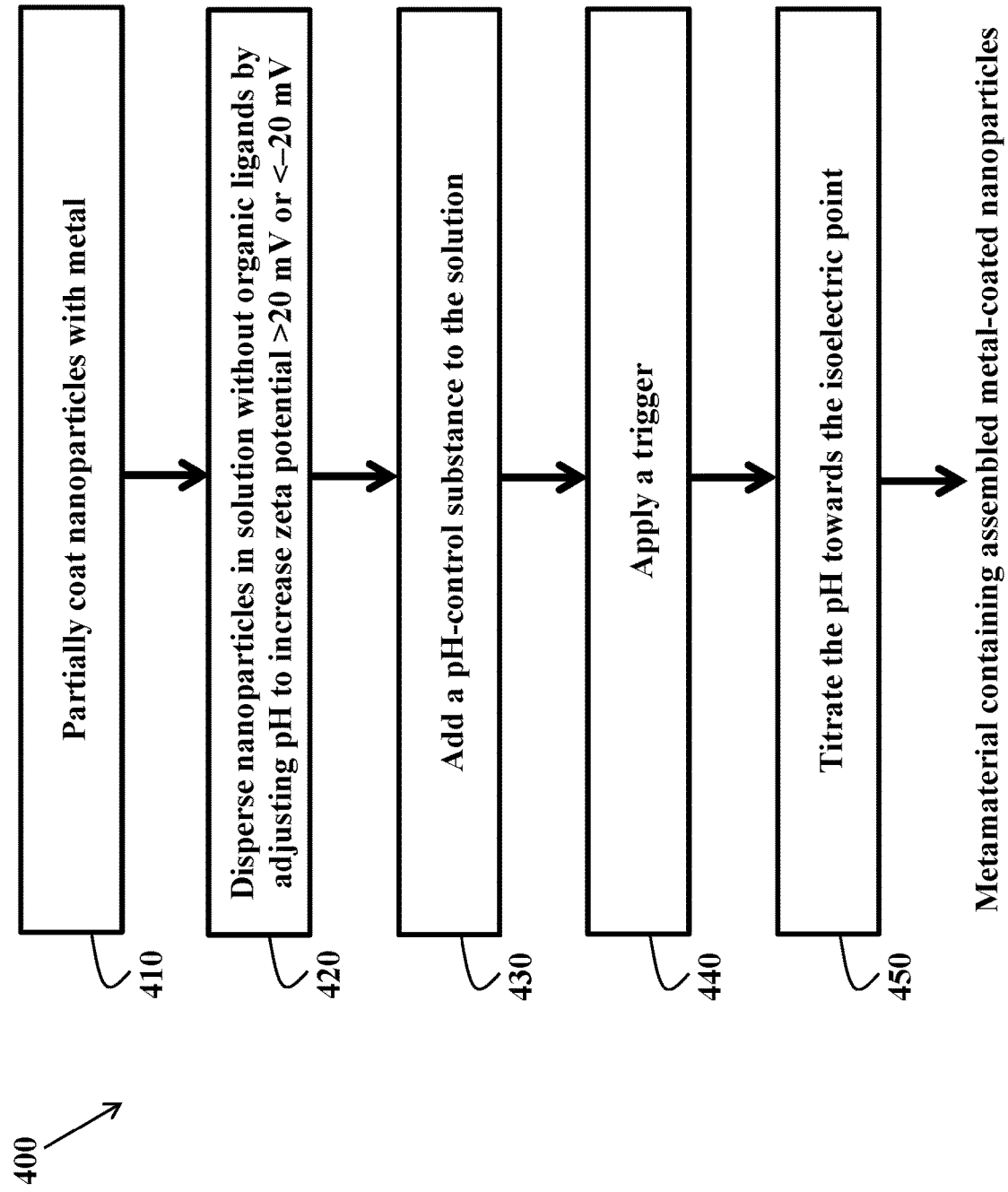
FIG. 4 is an exemplary flowchart for a method to produce a metamaterial containing assembled metal-coated nanoparticles, in some embodiments.

FIG. 4 is an exemplary flowchart for method 400, including steps 410, 420, 430, 440, 450 to produce a metamaterial containing assembled metal-coated nanoparticles, in some embodiments. The final material produced according to FIG. 4 may be the metamaterial 340 of FIG. 3, or some other metamaterial.

Charge-titrating particle assembly can create uniform, monodisperse structures or arrays with controlled order and complexity. Tightly packed, monodisperse, organic-free arrays of particles (e.g., nanoparticles) are useful for optical, magnetic, and electronic device applications, among other potential uses. Charge-titrating particle assembly, in some embodiments, forms multiple layers (such as 2, 3, 4, 5, 6, 7, 8, 9, 10 or more layers) of packed nanoparticles without organic ligands.

In some embodiments (such as fluoride-based nanoparticles), the nanoparticles may have inorganic ligands (e.g., tetrafluoroborate, $BF_4^-$ ligands) or other organic-free, positively or negatively charged ligands or hydrophilic ligands on the surface to help keep them dispersed in water. When present, the ligands may be loosely bound such that a zeta potential response with pH is observed.

Note that organic groups (including organic ligands) may be present in the solvent which is distinct from the particles in bulk solution. Also, organic material (e.g., an organic polymer) may be contained within or on the particles, but preferably not as organic ligands. In some embodiments, substantially no organic material is present on or in the particles. "Substantially no organic material," "free of organic ligands," and like terminology should be construed to recognize that there may be impurities or other species unintentionally present in these material assemblies, which do not significantly impact the properties of the material assemblies.

Figure 5:
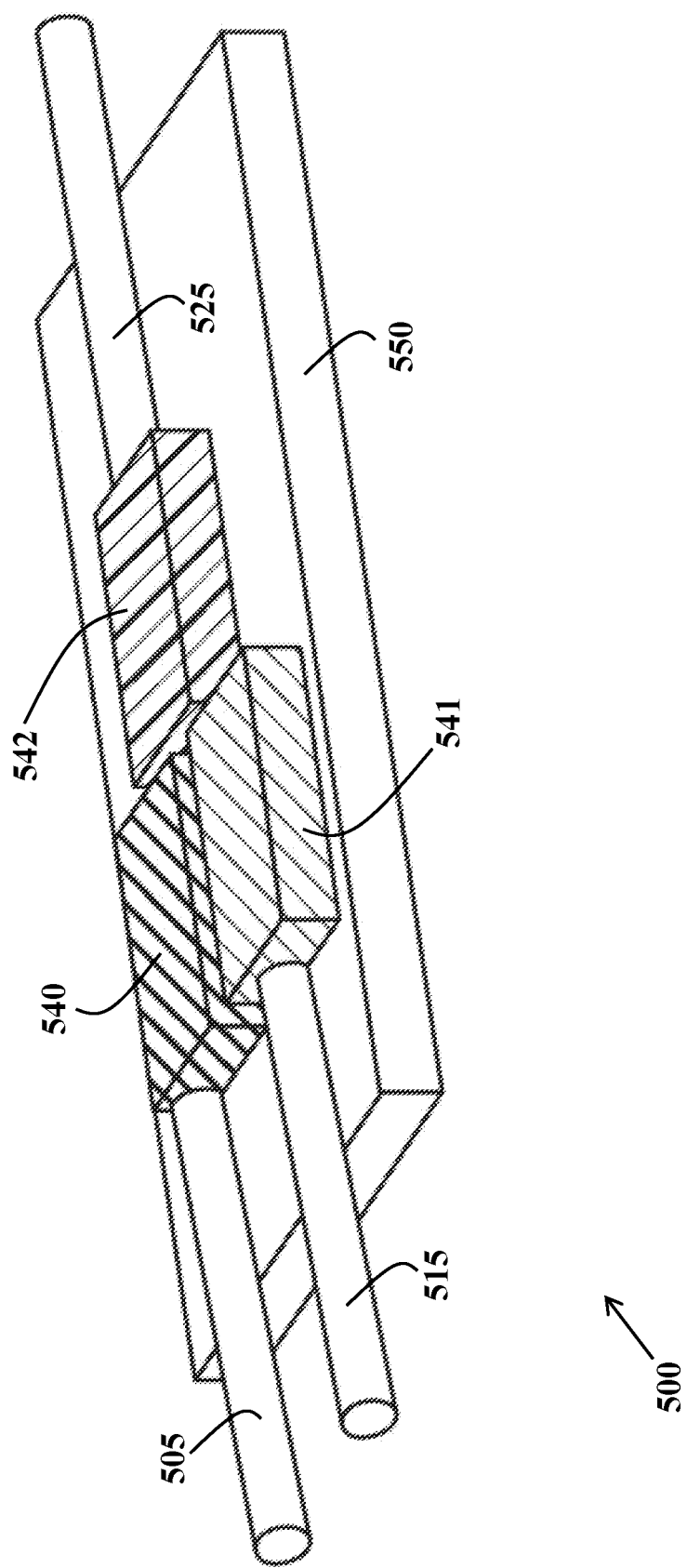
FIG. 5 is an illustration of a photonic microsystem, according to some embodiments.

Preferred methods do not employ a functional substrate, which means a solid substrate that chemically or physically enhances the charge-titrating particle assembly or array formation, with particles being deposited on the substrate. It should be recognized that a non-functional substrate may be included, such as an incidental substrate layer, an ornamental layer, or an adjacent layer. One of ordinary skill in the art will also realize that a substrate may be incorporated after the formation (without using a substrate) of the assembly. For example, the substrate 550 shown in FIG. 5 is not present during the initial formation of the metamaterial photonic components 540, 541, and 542.

In preferred embodiments, fully formed nanoparticles are assembled, instead of combining the synthesis of the nanoparticles themselves with the assembly process.

The bulk solution contains a solvent which may be selected from water, dimethyl formamide, dimethylsulfoxide, isopropanol or another alcohol, acetone, tetrahydrofuran, or mixtures of these solvents. The solvent preferably contains water.

Nanoparticles may be dispersed (i.e., dissolved and/or suspended as a colloid) in solution by adjusting the solution pH to increase the zeta potential above +20 mV or below −20 mV. In this disclosure, the notation "±20 mV" (for example) in reference to zeta potential means that the zeta potential is 20 mV in magnitude (absolute value) and may be either 20 mV or −20 mV; this does not refer to a range of values between −20 mV to 20 mV.

Brownian motion, sonication, gas sparging, and/or bulk mixing (e.g., agitation or vessel rotation) may be used to keep the nanoparticles suspended in solution.

The nanoparticles should be already formed (as individual nanoparticles) and not a solution of precursors. (A precursor for example would be a metal salt that contains cations or anions, matching the intended composition of the nanoparticles.) In some embodiments, a seed of assembled nanoparticles could be added to a dispersed solution of the same nanoparticles.

Electrostatic repulsion prevents the particles from agglomerating and may be controlled with initial pH. A salt such as NaCl, preferably with cations or anions that are not common with the nanoparticle composition, may be added to screen electrostatic charges in solution.

In addition to the nanoparticles, one or more triggerable pH-control substances are added to the solution. The triggerable pH-control substance is preferably selected from thermal acid generators, thermal base generators, photoacid generators, photobase generators, or a combination of the foregoing. A "photoacid generator," or "photoacid," is a molecule which releases an acid, or becomes more acidic upon absorption of light. This may be due either to the release of strong acids upon photolysis, or to formation of a strongly acidic excited state. A "photobase generator," or "photobase," is a molecule which releases a base, or becomes more basic upon absorption of light. This may be due either to the release of strong bases upon photolysis, or to formation of a strongly basic excited state. In this disclosure, a "strong acid" means an acid with a pKa value less than 4, such as less than 3, 2, 1, 0, −1, or −2. A "strong base" means a base with a pKb value less than 4, such as less than 3, 2, 1, 0, −1, or −2.

The triggerable pH-control substance may be capable of controllably generating a Lewis acid, a Brønsted acid, or an acid that is both a Lewis acid and a Brønsted acid. Similarly, the triggerable pH-control substance may be capable of controllably generating a Lewis base, a Brønsted base, or an acid that is both a Lewis base and a Brønsted base.

As an example, (4-fluorophenyl)diphenylsulfonium triflate is a photoacid generator and creates protons ($H^+$ ions) in response to UV light. As another example, sodium tetraphenylborate is a photobase generator and creates hydroxide ions in response to UV light. Another example is 2-(9-oxoxanthen-2-yl)propionic acid 1,5,7-triazabicyclo[4.4.0]dec-5-ene which is a photobase generator that contains multiple functional groups.

Urea is a thermal base generator and creates base (ammonia) from exposure to temperatures above 50° C. Sulfonate salts may be employed as thermal acid generators, creating protons ($H^+$ ions) in response to heat.

Note that some thermal acid/base generators are effective when temperature is reduced, rather than increased. For example, carbon dioxide solubility in solvent can be shifted, with temperature. Changing solubility will shift the carbon dioxide-carbonic acid equilibrium, resulting in a change in pH. In particular, lowering temperature will increase $CO_2$ solubility and result in acidification (via carbonic acid) of an aqueous medium.

The trigger source may be a source of energy that is thermal, optical, mechanical, electromechanical, electrical, acoustic, magnetic, or another effective source to trigger a selected pH-control substance. Combinations of trigger sources may also be employed, such as thermomechanical sources providing both heat as well as mechanical energy.

The triggerable pH-control substance may be triggered by something other than heat or electromagnetic radiation. Possible triggers include sound energy (sonication), or a trigger molecule (such as $CO_2$) which could be bubbled through solution, for example.

The solution is contained or placed in a container that preferably (i) does not lose physical integrity during heating and/or (ii) allows the transmission of light.

The pH of the solution is then titrated towards the isoelectric point, preferably uniformly (in space) within the solution to induce assembly of the nanoparticles. The pH titration is accomplished with the triggerable pH-control substance(s), such as a thermal acid/base generator or a photoacid/base generator, by heating the solution and/or exposing it to light at one or more effective wavelengths, thereby triggering the triggerable pH-control substance(s) so that pH is titrated in a controlled manner.

It is noted that agglomerated nanoparticles may be formed by adjusting the pH of a solution of dispersed nanoparticles with an acid or base solution, to near the isoelectric point of the nanoparticles. However, these nanoparticles will not be tightly packed. Therefore, in preferred embodiments of the present invention, the solution pH is not changed by only adding acid or base solutions, because this will result in pH spatial gradients in the solution. Such pH gradients will result in uncontrolled agglomeration instead of assembly of nanoparticles into tightly packed arrays.

In the present invention, "tightly packed" means a packing density of at least about 50 vol %, preferably at least about 60 vol %, more preferably at least about 70 vol %, even more preferably at least about 80 vol %, yet more preferably at least about 85 vol %, and most preferably at least about 90 vol %. The packing density is 100% minus the void (volume) density, i.e., tighter packing means fewer voids, and conversely, lower-density packing means a greater density of voids (open space). In certain embodiments, the packing density approaches 100 vol % of the theoretical packing density for the shape(s) of particles present.

It has been discovered that normal titration creates localized pockets of pH changes from gradients in added acid or bases, which gradients are undesirable. Uniform pH titration is desired in order to create tightly packed arrays of nanoparticles. Uniform pH titration is enabled by the use of a triggerable pH-control substance. Without wishing to be bound by theory, it is believed that uniform (in solution) pH titration is important because it allows control of particle surface charge. Changes in pH change the particle surface charge, which may be measured as surface-charge density.

Furthermore, the use of a triggerable pH-control substance allows the rate of change of pH to be controlled, by controlling the heat (or cooling) input or the amount of UV light input. It has been discovered experimentally that a preferred magnitude (absolute value) of rate of pH change is about 0.01 pH units per minute, or less, at or near the isoelectric point of the particles being assembled. When the pH is rising, the rate of pH change will be positive, and when the pH is falling, the rate of pH change will be negative. Thus "±0.01 pH units per minute, or less" means for example 0.01, 0.009, 0.008 or −0.01, −0.009, −0.008, and so on. In various embodiments, the rate of pH change is about ±0.05, ±0.04, ±0.03, ±0.02, ±0.01, ±0.009, ±0.008, ±0.007, ±0.006, ±0.005, ±0.004, ±0.003, ±0.002, ±0.001 pH units per minute, or less, measured at or near the isoelectric point of the particles being assembled. "Near the isoelectric point" means that the pH is within 2.0, 1.5, 1.0, 0.5, or 0.1 pH units of the isoelectric point. The pH rate of change may also be measured when the zeta potential of the assembling particles is in the range of −20 mV to +20 mV, −10 mV to +10 mV, −5 mV to +5 mV, −2 mV to +2 mV, or about 0 mV.

In some embodiments, heating or light exposure to the solution preferably is stopped when the solution pH is within 2.0, 1.9, 1.8, 1.7, 1.6, 1.5, 1.4, 1.3, 1.2, 1.1, 1.0, 0.9, 0.8, 0.7, 0.6, 0.5, 0.4, 0.3, 0.2, or 0.1 pH units of the isoelectric point of the particles being assembled. In these or other embodiments, heating or light exposure to the solution preferably is stopped when the zeta potential of the assembling particles is in the range of −15 mV to +15 mV, −10 mV to +10 mV, or −5 mV to +5 mV, for example. In some embodiments, heating or light exposure is reduced but not completely stopped at some intermediate solution pH or intermediate zeta potential, and then the heating or light exposure is completely stopped at a second solution pH (that is closer to the isoelectric point of the particles being assembled) or a second zeta potential (that is lower than the intermediate zeta potential). A buffer may optionally be used to slow down the rate of pH change near the isoelectric point or at other points during the titration.

The average zeta potential, prior to triggering the pH-control substance, is at least ±20 mV (i.e., +20 mV or more, or alternatively, −20 mV or less) and its magnitude is reduced in the method. That is, the zeta potential can start high (positive) and be reduced to a lower value, closer to zero. Or, the zeta potential can start highly negative and be increased to a lower magnitude (less negative), closer to zero. Thus for example when the average zeta potential is reduced from ±20 mV to ±10 mV, this ± notation means that either the average zeta potential is reduced from +20 mV to +10 mV, or increased mathematically (but reduced in magnitude) from −20 mV to −10 mV. In some embodiments, the average zeta potential is reduced to ±10 mV, ±5 mV, ±2 mV, ±1 mV, or less, at the titrated pH compared to the starting pH.

In some embodiments of the invention, the average zeta potential of the first particles in the liquid solution changes at a rate from about ±1 mV/hr to about ±50 mV/hr, i.e. a magnitude (absolute value) from about 1 mV/hr to about 50 mV/hr. In certain embodiments, the average zeta potential changes at a rate from about ±5 mV/hr to about ±30 mV/hr, i.e. a magnitude from about 5 mV/hr to about 30 mV/hr. The values may be positive or negative since the zeta potential may start negative or positive, and approach zero. In particular, when the average zeta potential is decreasing from a positive number toward zero (e.g. from 10 mV to 1 mV), the rate of change will be negative. When the average zeta potential is increasing from a negative number toward zero (e.g. from −10 mV to −1 mV), the rate of change will be positive.

It is hypothesized that, in some embodiments, the assembly is driven by a decreasing interparticle electrostatic repulsion, and that the microassembly yield and quality depends on the slowness of the rate of pH change. Long-range order is enabled by shifting the isoelectric point (IEP) of Al/FeOOH to match the ending pH of the assembly solution.

Figure 6A:
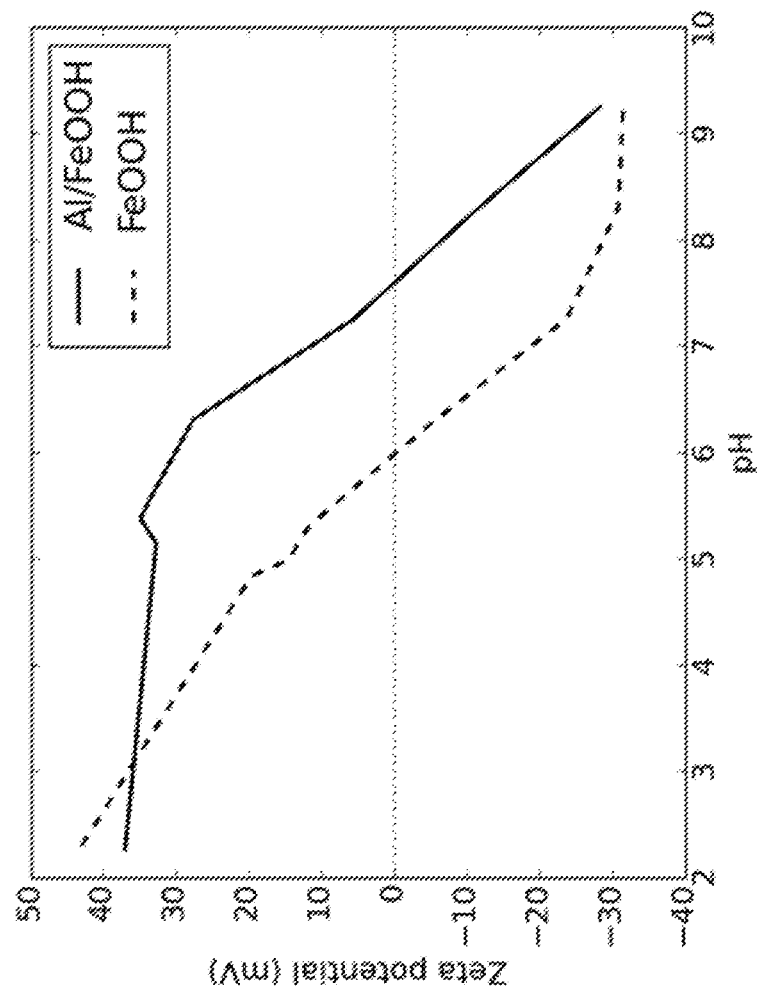
FIG. 6A is a zeta-potential titration curve of undoped and Al-doped β-FeOOH, showing a composition-dependent shift in isoelectric point, in some embodiments.
Figure 6B:
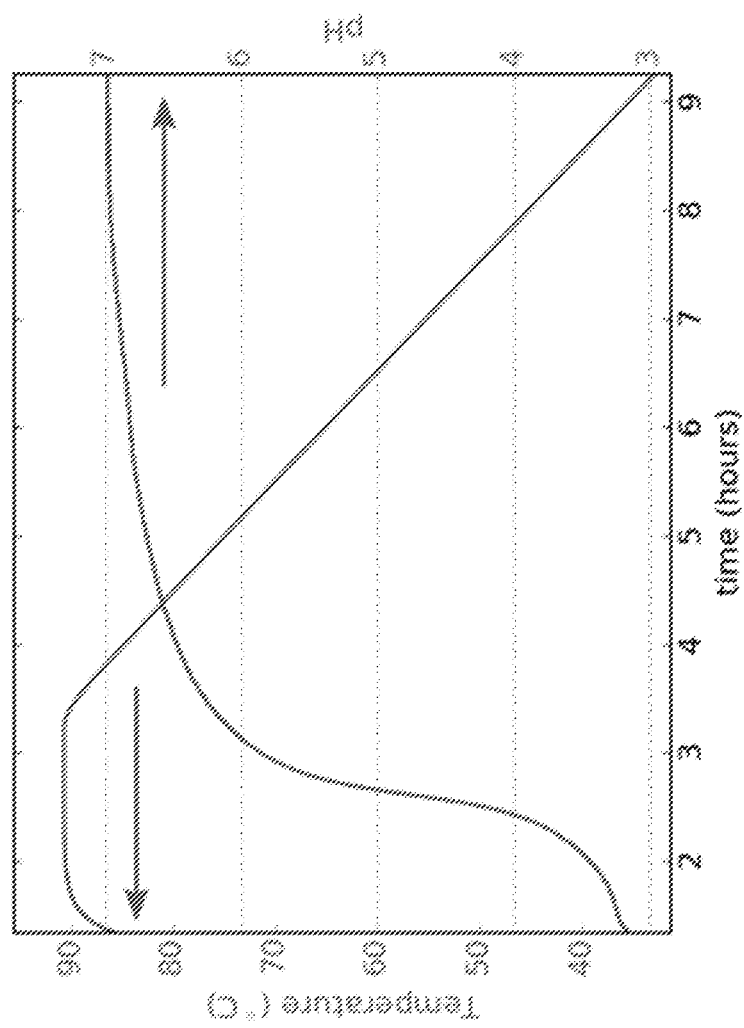
FIG. 6B is a plot of temperature and pH vs. time for urea decomposition, demonstrating the pH change that induces assembly of nanorods, in some embodiments.
Figure 6C:
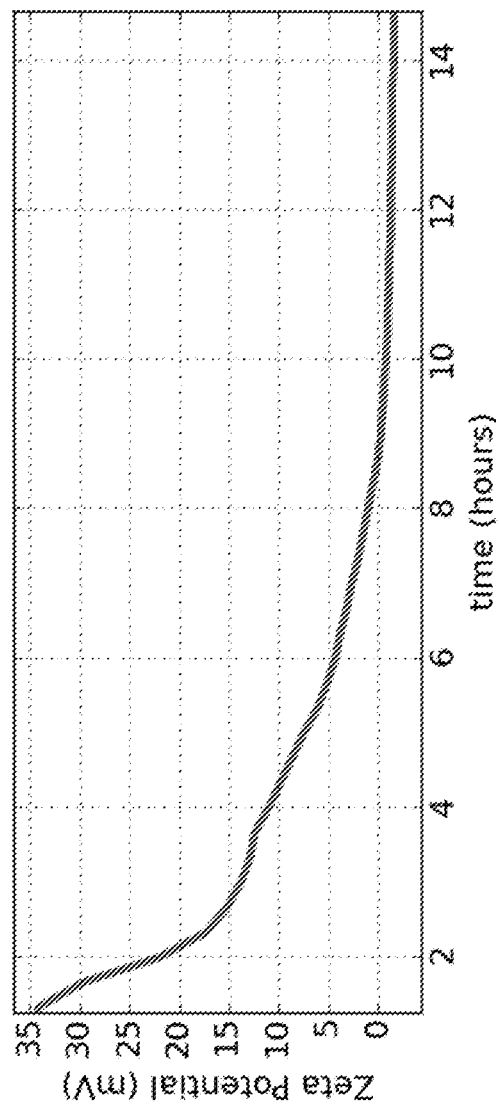
FIG. 6C is a plot of estimated zeta potential as a function of time during Al/FeOOH assembly, in some embodiments.

For example, FIG. 6A is a zeta-potential titration curve of undoped and Al-doped β-FeOOH, showing a composition-dependent shift in IEP with FeOOH IEP=6 and Al/FeOOH IEP=7.6. FIG. 6B shows a temperature and pH vs. time plot of urea decomposition in a sealed round-bottom flask, demonstrating the pH change that induces assembly of nanorods. FIG. 6C is the estimated zeta potential as a function of time during Al/FeOOH assembly. The data of FIG. 6C is extrapolated by correlating the urea decomposition curve (FIG. 6B) with the zeta potential titration curve of Al/FeOOH (FIG. 6A, solid black line).

The shifting of surface charges with pH demonstrates the electrostatic interactions present during assembly. Zeta-potential measurements of synthesized undoped and aluminum-doped FeOOH nanorods show that small changes in the composition affect the surface charges. Agglomeration occurs when the pH induces the nanoparticle surface to progress from a positive charge, where the electrostatic forces repel each other, to near zero charge, where van der Waals attraction dominates. Executing the pH titration slowly and uniformly throughout the solution is thought to be important to the assembly process. Standard methods of pH titration, e.g. burette titration, result in temporarily localized excess concentrations of acid or base, which yield non-uniform, rapid, and uncontrolled agglomeration of nanoparticles. By contrast, thermal decomposition of uniformly dissolved urea to control pH is much more uniform than burette titration.

The importance of a slow rate of pH change near the nanoparticles' isoelectric point on assembly quality has been demonstrated with FeOOH and Al/FeOOH nanorods. The isoelectric point (IEP), defined as the pH where the net surface charge is zero, was determined to be at pH 6 and 7.6 for FeOOH and Al/FeOOH, respectively. The shift of the IEP to higher pH is attributed to the presence of $Fe_2O_3$ (IEP=8-9) and of $Al_2O_3$ (IEP=7-9) in Al/FeOOH. X-ray diffraction of dried nanorods synthesized with aluminum salt shows approximately 15% content of $Fe_2O_3$, whereas nanorods synthesized without the aluminum salt results in relatively pure FeOOH. While only a small amount of elemental aluminum remains in the Al-doped FeOOH nanorods (<1 wt %), the aluminum appears to act as seeds for $Fe_2O_3$ domains inside the FeOOH nanorods. Compared to undoped FeOOH, Al-doped FeOOH nanorods have an isoelectric point better matched to the final pH of urea thermal decomposition. When undoped FeOOH nanorods are assembled, the change in pH, and subsequently the surface charge, near the isoelectric point (pH 6) occurs over 30 minutes, resulting in unordered aggregates. In contrast, Al/FeOOH nanorods (IEP 7.6) experience several hours of near-zero surface charge due to the IEP occurring on a relatively flat section of the pH versus time curve in FIG. 6B, and result in ordered and larger microassemblies than undoped FeOOH. Therefore, in order to achieve large 3D microassemblies, the ending pH is preferably within 1 pH unit above or below the isoelectric point, and several hours of approach to the IEP are preferred. The ending pH and the pH at which the slower rate of change occurs may be adjusted by varying the initial pH, the concentration of urea, and the reaction temperature profile. The achievable ending pH with urea as used in this Example ranges from 7 to 9.5, and altering its concentration enables the assembly of a wide range of materials with IEPs from 7 to 10.

Another option to achieve a slow change in pH is to control the cooling rate of the assembly solution after heat treatment. A notable feature of FIG. 6B is that the pH continues to increase while the reaction vessel cools in the oven. This is due to gaseous ammonia becoming more soluble in water at lower temperature and hence increasing the concentration of hydroxide as the temperature decreases. By cooling the vessel over several hours, Brownian motion can transform loosely agglomerated nanorods into an orderly and low-energy configuration. As a control, holding the nanoparticle suspension at the IEP pH at room temperature does not yield aligned nanorod microassemblies. This further highlights the importance of Brownian motion at elevated temperatures, and the benefit when particles begin the assembly process completely dispersed.

In some embodiments, the first particles are characterized by an average surface-charge density. When the pH-control substance is triggered to generate an acid or a base within the volume of liquid solution, thereby adjusting solution pH from the starting pH to a titrated pH, the average surface-charge density is lower at the titrated pH compared to the starting pH, thereby causing the first particles to assemble into a particle array. The average surface-charge density (at the titrated pH) may be, for example, from about 0 to about 0.05, 0.1, 0.15, 0.2, or 0.25 number of charges per $nm^2$ of surface.

The assembled nanoparticles are then separated from the solution. This separation may be done with centrifugation, filtration, evaporation of the solution, etc. The array of assembled nanoparticles is optionally dried to remove any residual solution. The array may then be utilized as a metamaterial.

Many additional variations on these methods are possible.

The pH of the solution, and thus the zeta potential of the particles being assembled, may be controlled temporally, spatially, or both temporally and spatially. In some embodiments employing temporal pH control, the intensity of UV light (or another suitable electromagnetic source) decreases over time to change the pH and thus the zeta potential more slowly as the isoelectric point is approached. The decrease could be gradual and continuous, or could be periodic step decreases, for example. In some embodiments employing spatial pH control, UV light (or another suitable electromagnetic source) is masked with a single-tone, two-tone, or gray-scale mask. Holography or interference lithography may also be employed, for example, in some embodiments employing spatial pH control, In some embodiments, the pH of the solution is varied in both time and in space to optimize the packing, such as to increase the size and/or alignment of the arrays. For example, a zone refinement could be implemented in which the solution is illuminated in a plane from a linear or near-linear source and the plane of illumination is translated through the solution volume, as a function of time.

The pH of the solution, and thus the zeta potential of the particles being assembled, may be oscillated in time to refine the packing, such as to increase the size and/or alignment of the arrays. For example, pH oscillation may be triggered by placing both a photoacid and a photobase in the solution, wherein the photoacid and photobase are susceptible to two different wavelengths, and then alternately exposing the solution to the two wavelengths.

In some embodiments, multiple pH control substances are utilized. The multiple pH control substances may have different triggers (e.g. one thermal trigger and one electromagnetic radiation trigger) or two of the same type of trigger but with different characteristics (e.g., electromagnetic radiation at two substantially different wavelengths). In certain embodiments, two of the multiple pH-control substances could act in opposite directions on pH (e.g. when triggered, one could generate acid while another could generate base). Selectively triggering one of the multiple pH-control substances, and then another, could be used to oscillate pH of the solution.

After a first set of particles is assembled, a second set of particles may be added to the solution. Then an existing (in solution) pH-control substance may be triggered, or a new pH-control substance may be added and triggered. The second set of particles preferably has a different isoelectric point from the first set of particles.

The assembly of the particles, in various embodiments, is characterized by an assembly rate (particles assembled per second) of about $10^6$, $10^7$, $10^8$, $10^9$, $10^{10}$, $10^{11}$, $10^{12}$ particles/second or higher. In general, the process of making assembled particle arrays may be conducted continuously, semi-continuously, or in batch mode.

In some embodiments, the method further comprises dispersing a plurality of second particles in the volume of liquid solution; wherein the second particles are distinct chemically and/or physically from the first particles; wherein the second particles are characterized by an average second particle-surface charge; and wherein the average second particle-surface charge is lower at the titrated pH compared to the starting pH, thereby causing the second particles to assemble.

A crystallized assembly containing the first particles may be introduced as a seed material in the volume of liquid solution.

Some embodiments are premised on incorporating an additional step of collecting the assembled particles, resuspending them in a new solution, adding additional particles, and triggering a pH change again.

In some embodiments, assembled arrays are harvested from the dispersed phase after assembly. This harvesting may be done with centrifugation, filtration, evaporation of the solution, or another effective type of separation. The array of assembled nanoparticles is optionally dried to remove any residual solution. The array may then be utilized as a metamaterial.

FIG. 5 is an illustration of a photonic microsystem 500 according to some embodiments. Multiple metamaterial photonic components 540, 541, 542 are first produced from surface-patterned particles, according to FIG. 3 or 4, for example. For instance, metamaterial photonic component 540 may be the same as, or include, metamaterial 340 shown in FIG. 3. The other metamaterial photonic components 541 and 542 may be the same as, or different than, component 540. The photonic microsystem 500 includes photonic input/output leads 505, 515, and 525 (e.g. silica optical waveguides) and a substrate 550 which may be a dielectric material or a semiconductor.

In order to be useful in larger devices, arrays of assembled particles are preferably uniform in size and shape (low polydispersity of array size). For example, in FIG. 5, the sizes and geometries of metamaterial photonic components 540, 541, 542 may be the same or similar.

In some embodiments, the array of particles includes or is derived from at least 10, 50, 100, 200, 300, 400, or 500 individual surface-patterned particles, and the array of surface-patterned particles is characterized by a packing density of at least 50%, 60%, 70%, 80%, or 90% on a volume basis.

The overall thickness of the final, assembled structure or metamaterial may be from about 10 nm to about 1 cm or more, such as about 50 nm, 100 nm, 250 nm, 500 nm, 750 nm, 1 µm, 10 µm, 20 µm, 25 µm, 30 µm, 40 µm, 50 µm, 75 µm, 100 µm, 500 µm, 1 mm, or larger.

A repeating, self-similar metamaterial structure allows the metamaterial to be abraded during use while retaining its properties. Should the surface be modified due to environmental events or influences, the self-similar nature of the metamaterial allows the freshly exposed surface to present a layer of surface-patterned particles identical to those which were removed.

The metamaterial may be present in a system selected from the group consisting of photonic systems, magnets, optical devices, optical filters, optical-absorbing systems, cloaking systems, electronic devices, electrochemical systems, and computers.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A method of making a metamaterial, said method comprising:
   (a) providing a plurality of particles;
   (b) metallizing surfaces of said particles, wherein at least some of said particles are coated with one or more metals in a surface pattern, thereby generating surface-patterned particles;
   (c) dispersing a plurality of said surface-patterned particles in a liquid solution characterized by a solution pH, wherein said surface-patterned particles are characterized by an average zeta potential, and wherein said solution pH is at a starting pH;
   (d) introducing to said liquid solution before, during, or after said surface-patterned particles are dispersed in said liquid solution, a triggerable pH-control substance capable of generating an acid or a base when triggered; and
   (e) triggering said pH-control substance to generate an acid or a base within said volume of liquid solution, thereby adjusting said solution pH from said starting pH to a titrated pH, wherein said average zeta potential is closer to zero at said titrated pH compared to said starting pH, causing said surface-patterned particles to assemble into a metamaterial.

2. The method of claim 1, wherein said particles comprise a dielectric material, a semiconductor material, or a combination thereof.

3. The method of claim 1, wherein said particles comprise a material selected from the group consisting of oxides, sulfides, phosphides, selenides, tellurides, fluorides, arsenides, silicon, and combinations thereof.

4. The method of claim 1, wherein said one or more metals are selected from the group consisting of gold, silver, copper, nickel, aluminum, and combinations thereof.

5. The method of claim 1, wherein said surface-patterned particles are partially coated with said one or more metals.

6. The method of claim 1, wherein said surface-patterned particles are fully coated with said one or more metals.

7. The method of claim 1, wherein said liquid solution comprises one or more compounds selected from the group consisting of water, dimethyl formamide, dimethylsulfoxide, isopropanol, acetone, tetrahydrofuran, and combinations thereof.

8. The method of claim 1, said method further comprising introducing an anion dispersal agent to said liquid solution.

9. The method of claim 8, wherein said anion dispersal agent is selected from borofluoride anions, thiocyanate anions, or a combination thereof.

10. The method of claim 1, wherein said pH-control substance is triggered with electromagnetic radiation to generate said acid or said base.

11. The method of claim 10, wherein said pH-control substance is a photoacid generator or a photobase generator selected from the group consisting of sodium tetraphenylborate, (4-fluorophenyl)diphenylsulfonium triflate, 2-(9-oxoxanthen-2-yl)propionic acid 1,5,7-triazabicyclo[4.4.0]dec-5-ene, and combinations thereof.

12. The method of claim 1, wherein said pH-control substance is triggered with a change in temperature to generate said acid or said base.

13. The method of claim 1, wherein said pH-control substance is urea, carbon dioxide, or a combination thereof.

14. The method of claim 1, wherein said pH-control substance is an acid gas selected from the group consisting of $CO_2$, $H_2S$, COS, $SO_2$, $SO_3$, NO, $NO_2$, $N_2O$, HCl, HF, HBr, $BCl_3$, $BF_3$, $Cl_2$, $SiCl_2H_2$, HI, $CH_3COOH$, HCOOH, and combinations thereof.

15. The method of claim 1, wherein said pH-control substance is an alkaline gas selected from the group consisting of $NH_4$, monomethylamine, diethylamine, trimethylamine, amines containing one or more alkyl or aryl groups, and combinations thereof.

16. The method of claim 1, wherein said pH-control substance is triggered in a spatial pattern within said volume of liquid solution or wherein said pH-control substance is triggered at temporally varying trigger intensity.

17. The method of claim 1, wherein said titrated pH is within about 1.0 pH units of the average isoelectric point of said surface-patterned particles.

18. The method of claim 1, wherein the magnitude of rate of change of said solution pH, measured at said titrated pH, is about 0.02 pH units per minute, or less.

19. The method of claim 1, wherein the magnitude of said average zeta potential is about 10 mV, or less, at said titrated pH compared to said starting pH.

20. The method of claim 1, wherein the magnitude of said average zeta potential changes at a rate from about 1 mV/hr to about 50 mV/hr during said adjusting solution pH from said starting pH to a titrated pH.

* * * * *